(12) United States Patent
Kim

(10) Patent No.: US 7,057,954 B2
(45) Date of Patent: Jun. 6, 2006

(54) SENSE AMPLIFIER SELECT CIRCUIT AND METHOD OF SELECTING THE SAME

(75) Inventor: Sung Ryong Kim, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 204 days.

(21) Appl. No.: 10/738,651

(22) Filed: Dec. 17, 2003

(65) Prior Publication Data

US 2004/0240281 A1 Dec. 2, 2004

(30) Foreign Application Priority Data

May 30, 2003 (KR) ................... 10-2003-0034893

(51) Int. Cl.
*G11C 7/00* (2006.01)

(52) U.S. Cl. .............. 365/205; 365/207; 365/208; 327/51; 327/52

(58) Field of Classification Search ............ 365/205, 365/207, 208; 327/51, 52
See application file for complete search history.

(56) References Cited

U.S. PATENT DOCUMENTS

| | | | |
|---|---|---|---|
| 5,999,471 A | 12/1999 | Choi | 365/222 |
| 6,134,169 A | 10/2000 | Tanaka | 365/222 |
| 6,434,075 B1 | 8/2002 | Ooishi | 365/222 |
| 6,515,926 B1 * | 2/2003 | Parris et al. | 365/205 |
| 6,519,199 B1 | 2/2003 | Ku | 365/222 |
| 6,768,692 B1 * | 7/2004 | Luk et al. | 365/205 |
| 2002/0001248 A1 | 1/2002 | Ku | 365/222 |
| 2003/0021159 A1 | 1/2003 | Issa | 365/189.02 |
| 2003/0030086 A1 | 2/2003 | Lin et al. | 257/296 |

FOREIGN PATENT DOCUMENTS

| | | |
|---|---|---|
| JP | 6028855 | 2/1994 |
| JP | 2002063788 | 2/2002 |

* cited by examiner

*Primary Examiner*—Richard Elms
*Assistant Examiner*—N. Nguyen
(74) *Attorney, Agent, or Firm*—Marshall, Gerstein & Borun LLP (57) ABSTRACT

The present invention relates to a sense amplifier select circuit for use in a memory device consisting of cell arrays and sense amplifier arrays arranged in a shared sense amplifier mode. The sense amplifier select circuit includes a first controller for outputting a sense amplifier select signal in response to a block select signal and an operation control signal of a sense amplifier, and a second controller connected to the first controller to control the sense amplifier select signal, wherein the second controller applies an enable/disable signal when selection of a cell array is changed and keeps the enable/disable state when a sense amplifier to be sensed within a selected cell array is changed. As such, a corresponding cell array is continuously connected/disconnected to/from a bit line sense amplifier. As a result, it is possible to significantly reduce consumption of current occurring due to toggle of a sense amplifier select signal.

6 Claims, 8 Drawing Sheets

SENSE AMPLIFIER SELECT CIRCUIT AND METHOD OF SELECTING THE SAME

BACKGROUND

1. Field of the Invention

The present invention relates to a semiconductor device and, more specifically, to a sense amplifier select circuit for use in a memory device consisting of cell arrays and sense amplifier arrays arranged in a shared sense amplifier mode, and method of selecting the same.

2. Discussion of Related Art

Generally, as the area of a cell becomes small, it becomes impossible to draw one bit line sense amplifier (BLSA) within a width of one cell. Therefore, a shared sense amplifier in which one bit line sense amplifier is drawn into two cell regions and the bit line sense amplifier is shared by neighboring upper and lower memory cell arrays, has been widely used. This shared sense amplifier mode can reduce a total chip area.

A sense amplifier connecting structure of a shared sense amplifier mode according to a prior art will now be described with reference to FIG. 1.

When a cell array (2) is driven, a bit line sense amplifier array (2) and a bit line sense amplifier (BLSA) array (3) are together driven to amplify all the cells of the cell array (2), so that they can be sensed. Accordingly, if the cell array (2) is selected, a cell array (1) and a cell array (3) are not selected. A bit line sense amplifier array (2) precludes a portion connected to the cell array (1) and the bit line sense amplifier array (3) precludes a portion connected to the cell array (3). For instance, if the cell array (2) is selected, signals (BISL2, BISL3) outputted from a sense amplifier select circuit (or bit line isolation circuit: now shown) become a logical Low and signals (BISH2, BISH3) outputted therefrom become a logical High. As a result, the cell array (2) is connected to the bit line sense amplifier arrays (2), (3).

Figure 1:
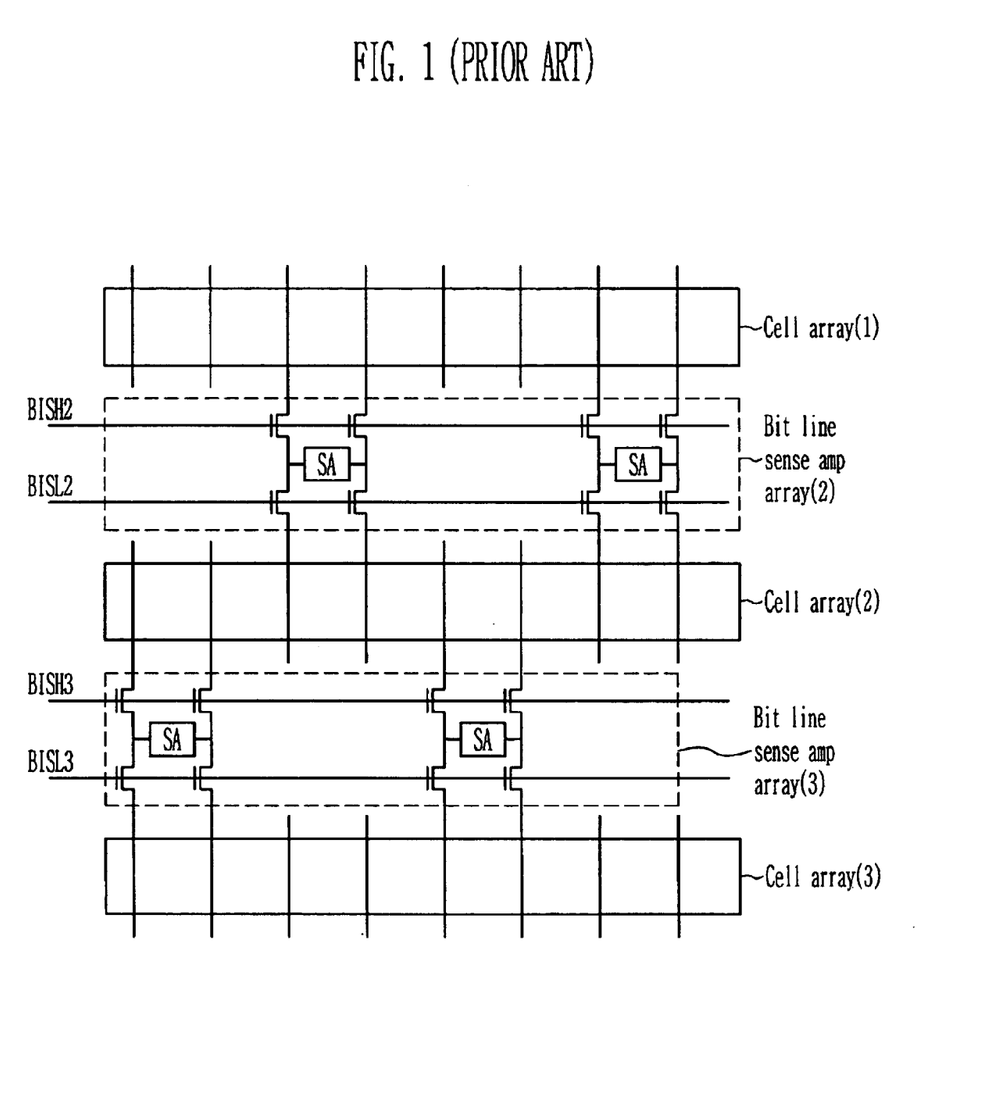
FIG. 1 is a diagram illustrating a sense amplifier connecting structure of a shared sense amplifier mode according to a prior art.
Figure 2:
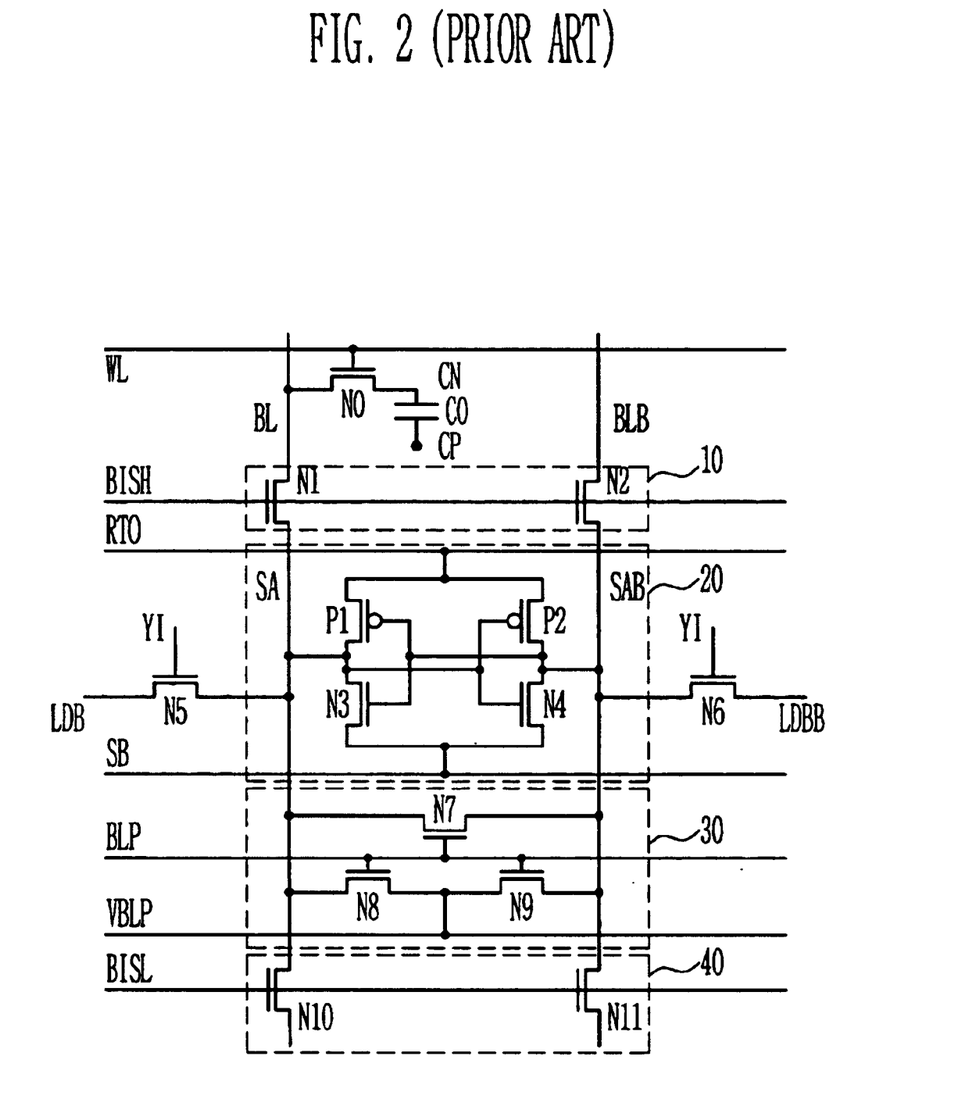
FIG. 2 is a partially expanded view of the sense amplifier structure of the shared sense amplifier mode shown in FIG. 1.

FIG. 2 is a partially expanded view of the sense amplifier structure of the shared sense amplifier mode shown in FIG. 1. In FIG. 2, only one cell and one bit line sense amplifier are shown in the cell array (2) and the bit line sense amplifier array (3). NMOS transistors N1, N2: 10 each having a gate to which a BISH signal is applied serve as a switch for connection to a cell on an upper side. NMOS transistors N10, N11: 40 to which BISL signals are applied serve as a switch for connection to a cell on a lower side.

Meanwhile, PMOS transistors P1, P2 for pulling up a bit line BL to a logical High and NMOS transistors N3, N4 for pulling down the bit line BL to a logical Low constitutes a sense amplifier 20. The structure further includes a bit line equalization circuit 30 having NMOS transistors N7, N8 and N9 for initializing the bit line BL and each node of the bit line sense amplifier BLSA by means of a bit line precharge signal (BLP), and NMOS transistors N5, N6 for transmitting data of the bit line BL to a line LDB in accordance with application of a column address (YI).

In such a structure, the bit line sense amplifier array 2 determines which of cell arrays 2 and 3 will be used based on a logical state of the BISH and BISL signals. If the cell array 2 is selected, the BISH signal becomes a logical High. Therefore, the NMOS transistors N1, N2 are turned on and data of the cell array 2 are transferred to the sense amplifier, so that they can be sensed. At this time, in the cell array 3 not selected, the BISL signal becomes a logical Low. The NMOS transistors N10, N11 are turned off and a path to the cell array 3 is thus precluded.

Meanwhile, in case where a memory such as a DRAM cell, etc. is employed, the memory has to be refreshed on a regular basis in order to keep cell data. To this end, the refresh operation is usually performed by means of an address counter, while increasing an internal address. A refresh operation that is generally performed in a shared sense amplifier mode shown in FIG. 2 will be described with reference to FIG. 3. As described above, a case where the cell array 2 and the bit line sense amplifier array 3 are connected will be described.

Figure 3:
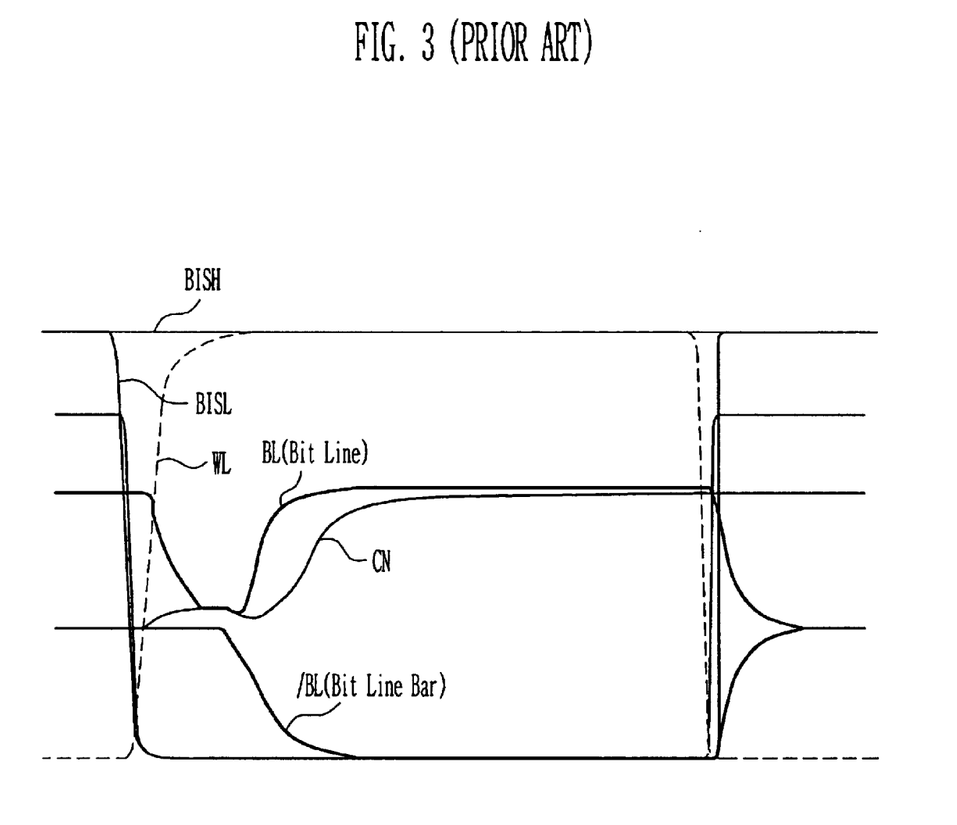
FIG. 3 is a graph showing a level of a control signal applied to each node in the shared sense amplifier mode shown in FIG. 2.

Referring to FIG. 3, in order to electrically connect the cell array 2 and the bit line sense amplifier array 3, a BISH signal of a logical High is applied to turn on the NMOS transistors N1, N2 and a BISL signal of a logical Low is applied to turn off the NMOS transistors N10, N11. Thereafter, after the bit line precharge (BLP) signal that initializes the bit line BL and a bit line_bar BLB is disabled to enable a word line WL, if the bit line sense amplifier BLSA is enabled, data of the cell node CN is shared. Its signal is amplified by the bit line sense amplifier BLSA and is then restored to the cell node CN. Thereby, the refresh operation is completed.

Figure 4:
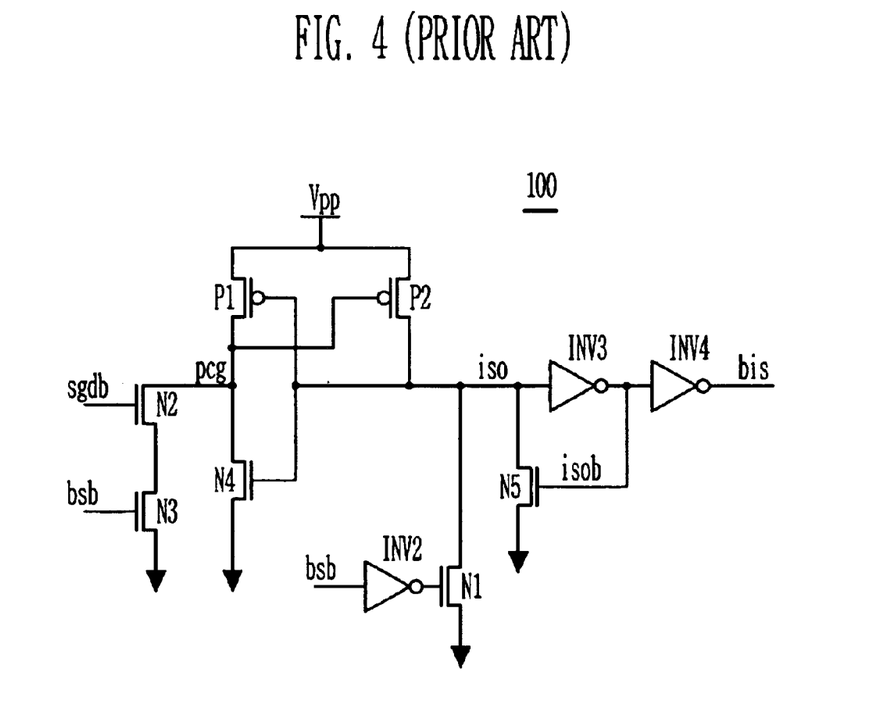
FIG. 4 is a: diagram showing the configuration of a sense amplifier select circuit according to a prior art.
Figure 5:
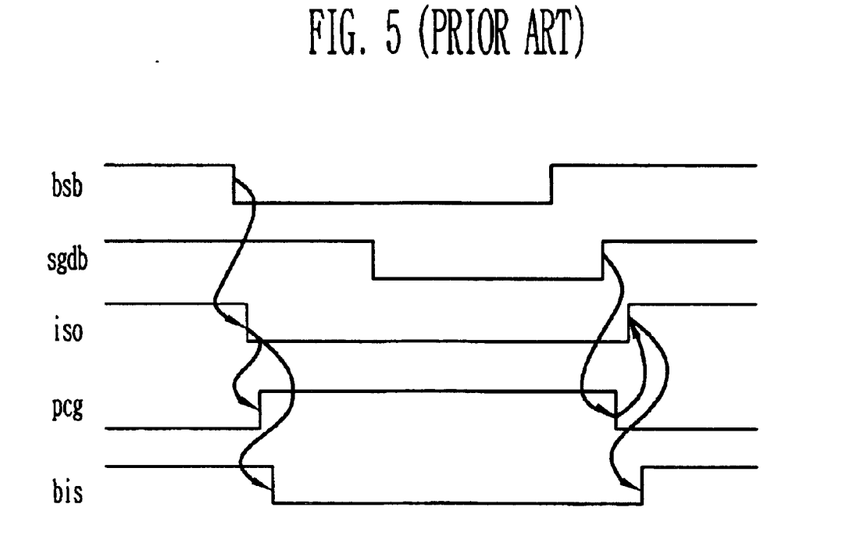
FIG. 5 is a waveform showing the operation of the sense amplifier select circuit according to a prior art.

FIG. 4 is a diagram showing the configuration of a sense amplifier select circuit according to a prior art and FIG. 5 is a waveform showing the operation of the sense amplifier select circuit according to a prior art.

Referring to FIG. 4, in a conventional sense amplifier select circuit 100, if a block select signal (Block Selection Bar: bsb) of a logical Low instead of a logical High is applied and a corresponding block is thus selected, the output of an inverter INV2 becomes a logical High. This High-level signal enables a NMOS transistor N1 to be turned on. The transistor N1 then enables a PMOS transistor P1 to be turned on, which allows a node pcg to be a logical High. Accordingly, a PMOS transistor P2 is turned off and a node iso keeps a logical Low. If the node iso keeps a logical Low, the signal (bis) that is amplified through inverters INV3, INV4 also keeps a logical Low. In this case, the node pcg keeps a logical High since the NMOS transistor N4 is turned off.

Thereafter, if an enable signal (sgdb) of the sense amplifier becomes a logical Low, the sense amplifier is at an enable state. If the enable signal (sgdb) becomes a logical High again, the sense amplifier finishes its sensing operation. At this time, the node pcg keeps a logical Low. In this case, if a logical High signal is applied to the node iso, the signal (bis) is outputted as a logical High through the inverters INV3, INV4. A NMOS transistor N5 serves as a latch. If an input does not have a specific function, the NMOS transistor N5 functions to keep the signal (bis) Low.

As described above, according to a prior art, as an address is continuously increased within one block due to the use of an internal counter upon a refresh operation, a refresh operation is continuously executed while a bit line is changed under a condition that the same cell array is selected. Accordingly, under this condition, as a cell voltage through one bit line is refreshed, a signal (BISH) must keep a logical High, while a signal (BISL) must continuously toggle a logical High and a logical Low. In other words, the NMOS transistors N10, N11 in FIG. 2 continuously toggle ON/OFF states. Due to this, there occurs a problem that unnecessary current is consumed.

In particular, in a pseudo SDRAM that performs a refresh operation on a regular basis once it enters a standby mode, standby current is increased. This poses a further serious problem.

SUMMARY OF THE INVENTION

The present invention is directed to a sense amplifier select circuit and a method of selecting the same capable of reducing current consumption.

According to one preferred embodiment of the present invention, there is provided a sense amplifier select circuit for use in a memory device having a plurality of cell arrays and sense amplifier arrays arranged in a shared sense amplifier mode, including a first control means for outputting a sense amplifier select signal in response to a block select signal and an operation control signal of a sense amplifier; and a second control means connected to the first control means to control the sense amplifier select signal, wherein the second control means applies an enable/disable signal when selection of a cell array is changed and keeps the enable/disable state when a sense amplifier to be sensed within a selected cell array is changed.

A self-refresh operation will be described by way of an example. An address to be refreshed is determined by an operation of an internal counter. Usually, an address is sequentially increased/decreased within one block. Therefore, a refresh execution within one block does not need to toggle a sense amplifier select transistor to an On/Off states. If a sense amplifier select transistor is controlled only when a block is changed in a standby mode, it is possible to significantly reduce current flowing into the transistor.

Preferably, a memory device using a DRAM cell consisting of one transistor and one capacitor may be utilized. A pseudo SRAM, SDRAM, DDR, etc. may be used.

According to another preferred embodiment of the present invention, there is provided a method of selecting a sense amplifier for use in a memory device having a plurality of cell arrays and sense amplifier arrays arranged in a shared sense amplifier mode, including the steps of receiving a row address from an internal counter in order to perform a self-refresh operation; and controlling a sense amplifier select signal using a block select signal, a sense amplifier control signal and the row address, wherein an enable/disable signal is applied if selection of a cell array is changed, and the enable/disable state keeps intact if a sense amplifier to be sensed within a selected cell array is changed.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 6:
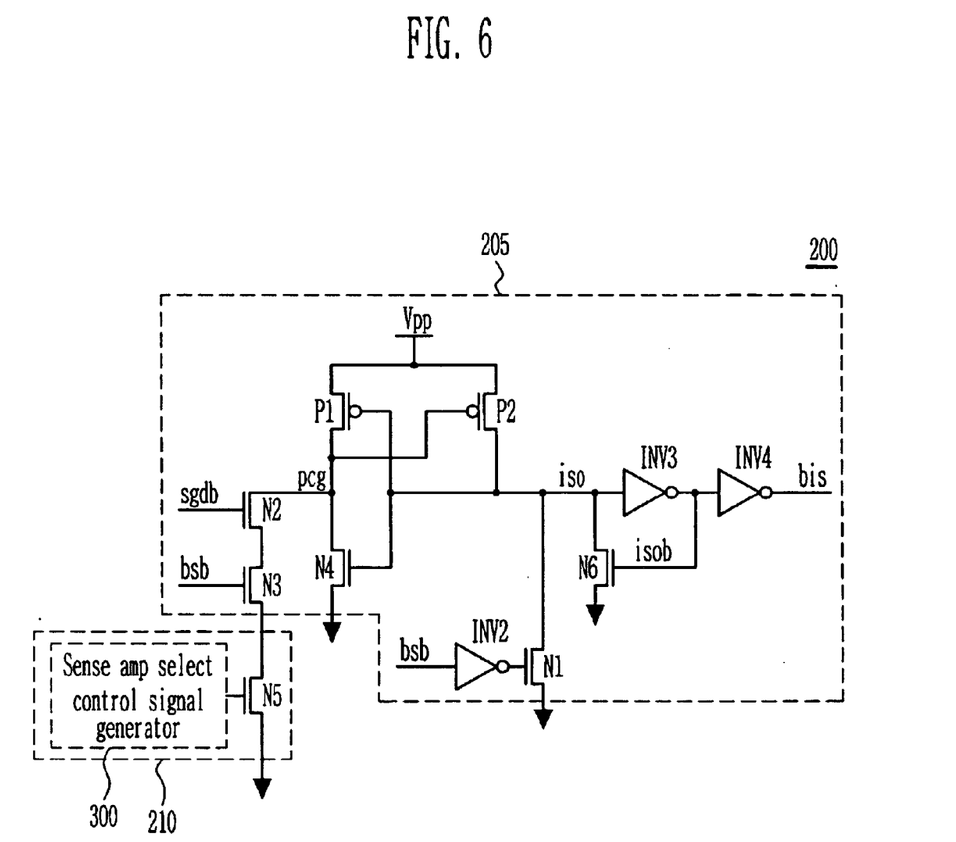
FIG. 6 is a diagram showing the configuration of a sense amplifier select circuit of a shared sense amplifier mode according to an embodiment of the present invention.

FIG. 6 is a diagram showing the configuration of a sense amplifier select circuit of a shared sense amplifier mode according to an embodiment of the present invention.

Referring to FIG. 6, a sense amplifier select circuit 200 for use in a memory device consisting of a plurality of cell arrays and a plurality of sense amplifier arrays, which are arranged in a shared sense amplifier mode, includes a first control means 205 for outputting a sense amplifier select signal in response to an operation of a block select signal and a signal to control a sense amplifier, and a: second control means 210 for applying an enable/disable signal when selection of a cell array is changed and keeping an enable/disable state when a sense amplifier to be sensed within a selected cell array is changed.

As can be seen from FIG. 6, the first control means 205 includes first and second PMOS transistors P1, P2 each having a source connected to power supply voltage (Vpp), wherein a gate of one of the transistors P1, P2 is connected to a drain (same node as pcg) of the other of the transistors P1, P2; a first NMOS transistor N1 connected between a gate (same node as iso) of the first PMOS transistor P1 and a ground voltage, wherein the transistor N1 is driven by an inverse signal of a block select signal (bsb); second and third NMOS transistors N2, N3 serially connected between a gate (same node as pcg) of the second PMOS transistor P2 and the ground voltage, wherein each of the transistors N2, N3 is driven by an operation control signal (sgdb) of the sense amplifier and the block select signal (bsb); and a fourth NMOS transistor N4 connected between the second PMOS transistor P2 and the ground voltage, to which the same signal as that applied to the gate of the first PMOS transistor P1 is applied.

Meanwhile, the second control means 210 includes a NMOS transistor N5 being a switching unit, and a sense amplifier select control signal generator 300.

Figure 8:
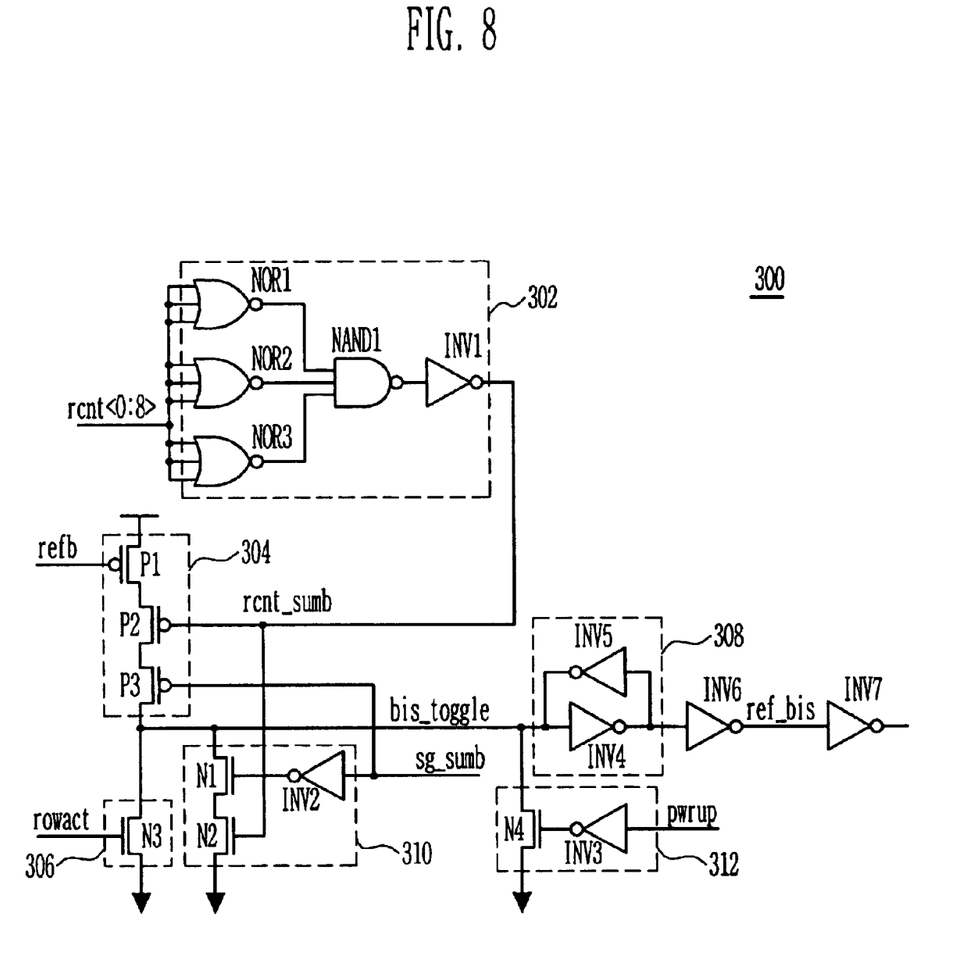
FIG. 8 is a diagram showing the detailed construction of a second control means in the sense amplifier select circuit shown in FIG. 6 according to an embodiment of the present invention.

From the above description, it can be seen that the construction of the sense amplifier select circuit according to the present invention is same as a conventional sense amplifier select circuit except that it further includes the second control means 210. For convenience, a portion of the second control means 210 is shown in FIG. 6 and the sense amplifier select control signal generator 300 is shown in FIG. 8. The NMOS transistor N5 of the second control means 200 functions to control a sense amplifier select signal (bis) in response to an inverted sense amplifier select control signal (ref_bis). Referring to FIG. 8, the inverted sense amplifier select control signal (ref_bis) is adapted to control the operation of the NMOS transistor N5.

In other words, in a conventional sense amplifier select circuit, as a logical state is changed when a selected cell array is changed and when a sense amplifier to be sensed within a cell array is changed, toggling of the sense amplifier select signal unnecessarily takes place. In the present invention, however, the structure is constructed so that the sense amplifier select signal is not toggled in case where a sense amplifier to be sensed within a cell array is changed. Accordingly, in a structure in which a sense amplifier is driven while sequentially changing only a sense amplifier selected in case where a cell array is selected, in particular, as in a self-refresh operation, etc., it is possible to significantly reduce current consumption.

Figure 7:
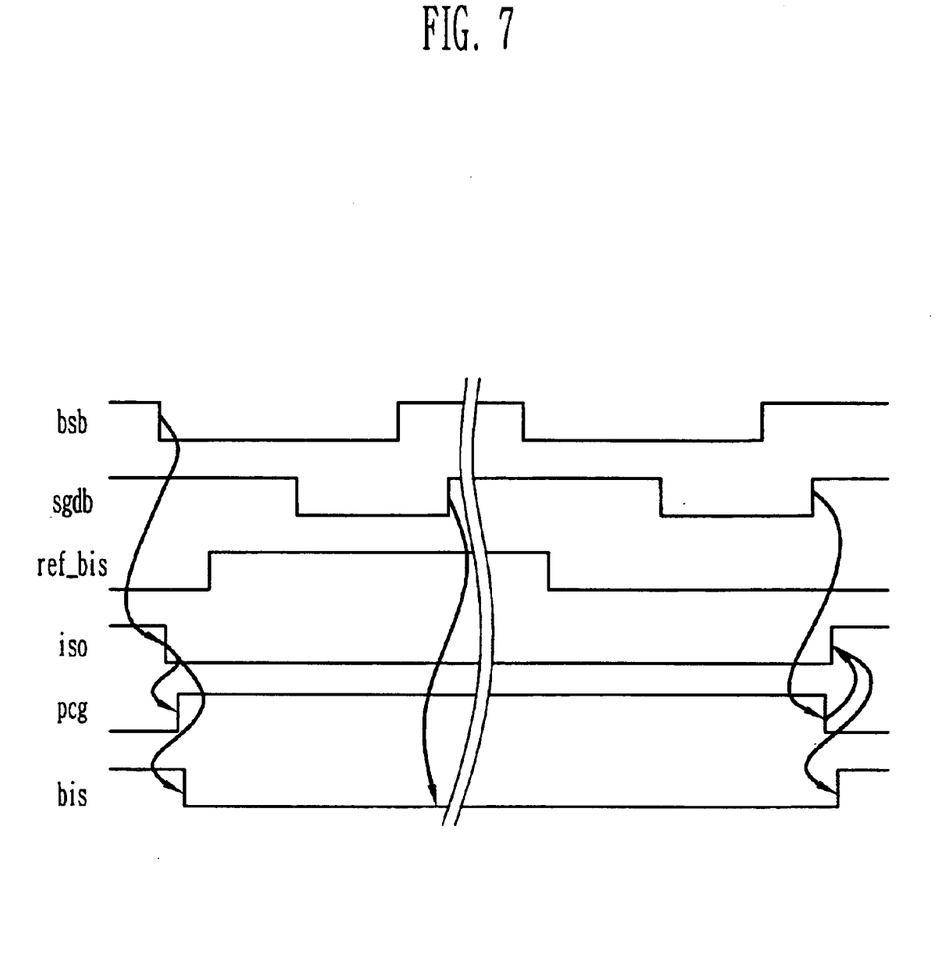
FIG. 7 is a waveform indicating the operation of the sense amplifier select circuit according to an embodiment of the present invention.

An operation of the sense amplifier select circuit according to an embodiment of the present invention will now be described with reference to FIG. 7, which shows a waveform indicating the operation of the sense amplifier select circuit. Compared with a prior art, in case where the sense amplifier select control signal (ref_bis) is at a logical Low a sense amplifier select signal becomes a logical Low when the block select signal (bsb) is enabled (a logical Low), and the sense amplifier select signal becomes a logical High when the signal (sgdb) to control the operation of the bit line sense amplifier becomes a logical High (i.e., when the operation of the bit line sense amplifier is finished). The sense amplifier select circuit is thus prepared to perform a next operation. On the contrary, in the event that the sense amplifier select control signal (ref_bis) is at a logical High, the sense amplifier select signal keeps a logical Low regardless of a logical state of the operation control signal (sgdb) of the bit line sense amplifier. As a result, current consumption due to toggling of the sense amplifier select signal (bis) can be reduced.

An example in which the present invention is applied to a standby mode wherein a self-refresh operation is performed will now be described. A sense amplifier select control signal (ref_bis) is generated using an internal address (for example, assuming that one block consists of 512 rows, and 9 row addresses (rcnt<0:8>) are inputted) signal for the refresh operation, which is received from the internal address counter. In other words, the sense amplifier select circuit may be constructed so that the sense amplifier select control signal (ref_bis) becomes a logical Low when all the internal addresses are at a logical Low and the sense amplifier select control signal (ref_bis) becomes a logical High when the internal address is continuously increased.

A detailed construction of the sense amplifier select control signal generator 300, a portion of the second control means 210 of the present invention, will now be described with reference to FIG. 8. The sense amplifier select control signal generator 300 includes a row address sense unit 302, a pull-up circuit 304, a pull-down circuit 310 and a latch unit 308. The generator 300 may further include a power application sensor 312, etc. In case where the row address sense unit 302 uses a self-address signal received from the internal counter (now shown) for a self refresh, an external row address sense unit 306 for sensing whether an external row address is applied, and the like.

A power application signal (pwrup) is a signal that is changed from a logical Low to a logical High as the power is applied. A row activation signal (rowact) is applied as a logical High in a normal operation not a standby state and indicates whether it is at a standby state. A refresh control signal (refb) is a signal to control a refresh execution.

The row address sense unit 302 controls the pull-up circuit 304 and the pull-down circuit 310 depending on a row address for self-refresh inputted thereto. For example, the row address sense unit 302 may include NOR devices NOR1, NOR2 and NOR3 each of which receives 3 addresses, a NAND device NAND1 for outputting three outputs inputted thereto using a single terminal, and an inverter INV1. The row address sense unit 302 enables a node rcnt_sumb to be High only when all the internal row addresses (rcnt<0:8>) for the refresh that are outputted from the internal address counter (now shown) are at a logical Low (when a new select block starts). As shown in FIG. 8, if all the row addresses (rcnt<0:8>) are at a logical Low (indicated by "000" in sixteenth decimals), it means that a new block has started. A signal that passed through the row address sense unit 302 becomes a logical High, which then turns off the PMOS transistor P2 and turns on the NMOS transistor N2.

The pull-up circuit 304 receives the refresh control signal (refb), the output from the row address sense unit 302, and the sense amplifier control signal (sg_sumb). The pull-up circuit 304 then pulls up the node bis_toggle to a logical High if those signals meet a given condition. The pull-up circuit 304 has three PMOS transistors P1, P2 and P3 all of which are serially connected between the power supply voltage and the node bis_toggle.

The pull-down circuit 310 receives the sense amplifier control signal (sg_sumb) and the output of the row address sense unit 302, and then pulls down the node bis_toggle to a logical Low if those signals meet a given condition. The pull-down circuit 310 includes two NMOS transistors N1, N2 serially connected between the ground voltage and the node bis_toggle, and an inverter INV2.

The latch unit 308 includes inverters INV4, INV5 interconnected in a back-to-back scheme and functions to latch a control signal applied to the node bis_toggle.

The external address sense unit 306 functions to sense whether an external row address has been applied during a self-refresh operation. If an external address is at a logical High, the unit 306 enables the sense amplifier select control signal (ref_bis) to be Low due to variation in the node bis_toggle, by making a ground voltage applied to the node bis_toggle.

The power application sensor 312 serves to separate the node bis_toggle from the ground voltage through the inverter INV3 and the NMOS transistor N4 when the power application signal (pwrup) generating when the power is initially applied to a chip is changed from a logical Low to a logical High.

Figure 9:
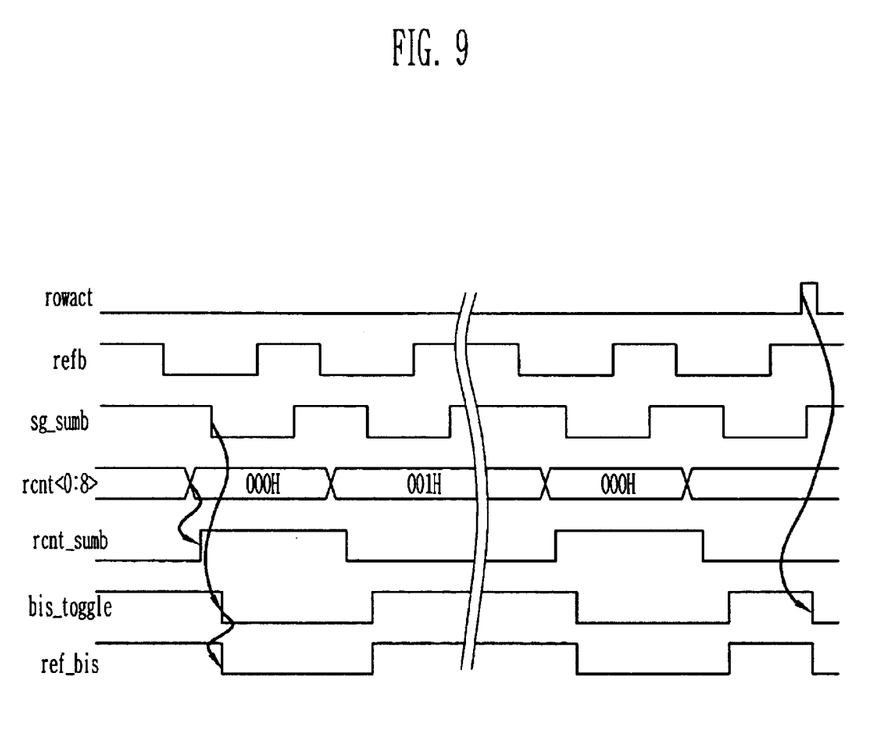
FIG. 9 is a timing diagram of the second control means according to an embodiment of the present invention.

The operation of a second control means will now be described with reference to FIGS. 6, 8 and 9. FIG. 9 is a timing diagram of the second control means according to an embodiment of the present invention.

If all the row addresses (rcnt<0:8>) are at a logical Low (indicated by "000" in sixteenth decimals), it means that a new block has started. A signal that passed through the row address sense unit 302 becomes a logical High, which then turns off the PMOS transistor P2 and turns on the NMOS transistor N2.

Meanwhile, if the bit line sense amplifier enable signal (sg_sumb) of a logical Low turns on the NMOS transistor N1 and the PMOS transistor P3 and thus enables the node bis_toggle to be Low, the sense amplifier select control signal (ref_bis) becomes a logical Low through the latch units INV4, INV5 and the inverter INV6. The sense amplifier select control signal (ref_bis) is inputted to the first control means 205 of the sense amplifier select circuit 200 through the inverter INV7. Only when a new cell array (block) is selected, the sense amplifier select signal is toggled.

Meanwhile, the selected block keeps intact. All the row address signals, which are inputted when the internal address is increased by 1, are not at a logical Low. In this case, the row address sense unit 302 outputs a logical Low and the node rcnt_sumb becomes a logical Low. Thus the PMOS transistor P2 is turned on and the NMOS transistor N2 is turned off. As a result, the node bis_toggle becomes a logical High and the sense amplifier select control signal (ref_bis) becomes a logical High while passing through the latch units INV4, INV5 and the inverter INV6.

Therefore, the sense amplifier select control signal (ref_bis) keeps intact until all the row address signals become a logical Low. That is, if all the row address signals are not at a logical Low (when the rcnt<0:8>signal of FIG. 8 is not "000" in sixteen decimals), the sense amplifier select control signal (ref_bis) becomes a logical High.

If an external row address is inputted and the external address activation signal (rowact) becomes a logical High, the node bis_toggle is grounded by the NMOS transistor N3 in order to finish a self-refresh operation.

A device driven by a sense amplifier select signal may usually include a NMOS transistor. When the NMOS transistor transfers data of a High level, the threshold voltage (Vt) drops. A sense amplifier select signal to control this transistor applies a power supply voltage (Vpp) higher than the internal voltage. As efficiency of voltage generated is around 30%, however, a large amount of current is consumed in reality.

Furthermore, in order to reduce a chip size usually, one cell array approximately consists of 2 k (2048 in number) to 8 k (8192 in numbers). In this case, the number of a bit line sense amplifier is 1 k (2048 in number) to 4 k (8192 in number). As two transistors for a sense amplifier are connected every bit line sense amplifier, a load of a sense amplifier select signal may be significantly high.

According to the present invention described above, the present invention contemplates that an internal address is continuously increased within one block in a self-refresh state. Therefore, toggle is not made and a corresponding cell array is continuously connected/disconnected to/from a bit line sense amplifier. Therefore, the present invention has an effect that it can significantly reduce consumption of current occurring due to unnecessary toggle of a sense amplifier select signal.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A sense amplifier select circuit for use in a memory device having a plurality of cell arrays and sense amplifier arrays arranged in a shared sense amplifier mode, comprising:
    a first control means for outputting a sense amplifier select signal in response to a block select signal and an operation control signal of a sense amplifier; and
    a second control means connected to the first control means to control the sense amplifier select signal, wherein the second control means applies an enable/disable signal when-selection of a cell array is changed and keeps the enable/disable state when a sense amplifier to be sensed within a selected cell array is changed.

2. The sense amplifier select circuit as claimed in claim 1, wherein the sense amplifier select circuit operates in a standby mode in which a self-refresh is executed.

3. The sense amplifier select circuit as claimed in claim 1, wherein the first control means comprises:
    first and second PMOS transistors each having a source connected to a power supply voltage, wherein a gate of one of the first and second PMOS transistors is connected to a drain of the other of the first and second PMOS transistors;
    a first NMOS transistor connected between a gate of the first PMOS transistor and a ground voltage, wherein the first NMOS transistor is driven by an inverse signal of the block select signal;
    second and third NMOS transistors serially connected between a gate of the second PMOS transistor and the ground voltage, wherein each of the second and third NMOS transistors is driven by the operation control signal of the sense amplifier and the block select signal; and
    a fourth NMOS transistor connected between the second PMOS transistor and the ground voltage, to which the same signal as that applied to the gate of the first PMOS transistor is applied.

4. The sense amplifier select circuit as claimed in claim 3, wherein the second control means comprises a switching unit and a sense amplifier select control signal generator,
    the switching unit is a fifth NMOS transistor connected between the third NMOS transistor and the ground voltage, and driven by a sense amplifier select control signal, and
    the sense amplifier select control signal generator comprises:
    a row address-sensing unit for receiving an internal row address for refresh, which is outputted from an internal address counter, to sense whether selection of a cell array is changed;
    a pull-up unit having PMOS transistors serially connected between the power supply voltage and an output terminal for outputting the sense amplifier select control signal, for pulling up the power supply voltage using the output from the row address sense unit and the sense amplifier select control signal;
    a pull-down unit having NMOS transistors serially connected between the ground voltage and the output terminal, for receiving and pulling down the sense amplifier select control signal and the output from the row address sensing unit to the ground voltage; and
    a latch unit connected to the output terminal.

5. The sense amplifier select circuit as claimed in claim 1, wherein the memory device is a pseudo SRAM, DDR or SDRAM.

6. A method of selecting a sense amplifier for use in a memory device having a plurality of cell arrays and sense amplifier arrays arranged in a shared sense amplifier mode, comprising the steps of:
    receiving a row address from an internal counter in order to perform a self-refresh operation; and
    controlling a sense amplifier select signal using a block select signal, a sense amplifier select control signal and the row address, wherein an enable/disable signal is applied if selection of a cell array is changed, and the enable/disable state keeps intact if a sense amplifier to be sensed within a selected cell array is changed.

* * * * *

UNITED STATES PATENT AND TRADEMARK OFFICE
CERTIFICATE OF CORRECTION

| | | |
|---|---|---|
| PATENT NO. | : 7,057,954 B2 | |
| APPLICATION NO. | : 10/738651 | |
| DATED | : June 6, 2006 | |
| INVENTOR(S) | : Sung R. Kim | |

It is certified that error appears in the above-identified patent and that said Letters Patent is hereby corrected as shown below:

Claim 1
At Column 7, line 59, "when-selection" should be -- when selection --.

Signed and Sealed this

Seventeenth Day of May, 2011

David J. Kappos
*Director of the United States Patent and Trademark Office*